United States Patent
Lee et al.

(10) Patent No.: US 7,722,966 B1
(45) Date of Patent: May 25, 2010

(54) NANO-COMPOSITE MATERIALS

(75) Inventors: Se-Hee Lee, Lakewood, CO (US); C. Edwin Tracy, Golden, CO (US); J. Roland Pitts, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 838 days.

(21) Appl. No.: 11/128,148

(22) Filed: May 11, 2005

(51) Int. Cl.
 B32B 15/00 (2006.01)
 B32B 15/04 (2006.01)
 C23C 14/00 (2006.01)
 C23C 14/34 (2006.01)

(52) U.S. Cl. .............. 428/702; 204/192.1; 204/192.11; 204/192.15; 204/192.17; 204/192.28; 428/701

(58) Field of Classification Search .................. None
See application file for complete search history.

(56) References Cited

U.S. PATENT DOCUMENTS 6,376,349 B1 * 4/2002 Tobin et al. ................. 438/592
6,416,584 B1 * 7/2002 Won et al. ................... 118/715
6,642,295 B2    11/2003 Border et al.
6,813,931 B2    11/2004 Yadav et al.
6,859,297 B2    2/2005 Lee et al.

FOREIGN PATENT DOCUMENTS

WO    WO 03/014254    * 2/2003

OTHER PUBLICATIONS

Lee, Se-Hee et al., "Solid-State Nanocomposite Electrochromic Pseudocapacitors," Electrochemical and Solid-State Letters-2005, vol. 8, Issue 4, pp. A188-A190.
Hyeok, Kay An et al., "High-Capacitance Supercapacitor Using a Nanocomposite Electrode of Single-Walled Carbon Nanotube and Polypyrrole" J. of the Electrochemical Society, 149 (8), pp. A 1058-A 1062 (2002).

* cited by examiner

Primary Examiner—Aaron Austin
(74) Attorney, Agent, or Firm—Paul J. White

(57) ABSTRACT

Nano-composite materials are disclosed. An exemplary method of producing a nano-composite material may comprise co-sputtering a transition metal and a refractory metal in a reactive atmosphere. The method may also comprise co-depositing a transition metal and a refractory metal composite structure on a substrate. The method may further comprise thermally annealing the deposited transition metal and refractory metal composite structure in a reactive atmosphere.

27 Claims, 10 Drawing Sheets

NANO-COMPOSITE MATERIALS

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

TECHNICAL FIELD

The described subject matter relates to nano-composite materials having a nano-crystalline phase embedded in an amorphous phase.

BACKGROUND

Growing energy demands and dwindling resources have increased demand for both alternative forms of energy and energy savings. For example, hydrogen and electric automobiles are now commercially available and increasing in popularity. Alternative fuel vehicles, such as these, typically require large energy stores (e.g., for acceleration), resulting in the ongoing development of capacitor and "super"-capacitor technologies. Of course these technologies have a broad range of applications including portable electronic devices, e.g., cell phones, lap top computers and personal digital assistants and are not limited to use in automobiles.

In general, an electrochemical capacitor with a large specific capacitance is produced by combining an electrode material having a large specific surface area with a material that can be reversibly oxidized or reduced over a wide potential range. Carbon powders and conducting polymers have a large double layer capacitance and multivalent metal oxides (e.g., ruthenium and iridium oxides) exhibit large Faradic pseudo capacitance. Accordingly, these materials have often been studied for application as "super"-capacitors. An amorphous phase of $RuO_2:XH_2O$ formed by the sol-gel method at low temperatures shows a specific capacitance as high as 720 F/g in an acidic electrolyte, but the high cost of these materials detracts from their commercialization.

Electrochromic coatings are also being developed in an effort to promote energy savings. Applications include energy-efficient, dynamically-controlled (so-called "smart") windows, sunroofs, as well as opto-electronic "shutters." A variable transmittance window coating operated as part of an intelligent building energy management system can provide substantial energy savings. In particular, electrochromic windows may be used to control solar heat gain through windows and thereby reduce energy requirements, e.g., for air-conditioning in automobiles and buildings. Of course these technologies also have a broad range of other applications, e.g., anti-glare automobile rearview mirrors and other surfaces.

Inorganic electrochromic coatings operate by insertion of ionic species into a host lattice to effect changes in the optical properties. For example, amorphous tungsten oxide films appear transparent. Injecting lithium (or hydrogen) ions and electrons causes the film to absorb light and the color of the film to take on a dark blue appearance. This color change in the films is directly related to the double injection/extraction of electrons and ions in the films, which can be written in simplified form as:

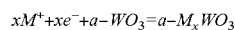

$$xM^+ + xe^- + a\text{-}WO_3 = a\text{-}M_xWO_3$$

where M=H, Li, etc.

When lithium (or others, e.g., sodium, potassium, hydrogen, etc.) ions and electrons are injected into amorphous tungsten oxide films, the electrons reduce $W^{6+}$ ions to $W^{5+}$. Lithium or hydrogen ions are necessary to satisfy the charge neutrality condition inside the film. However, ion insertion results in cyclic expansion and contraction of the bulk structure, and over time, deteriorates the electrochromic material and thus limits the operational life of an electrochromic device.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Exemplary nano-composite materials described herein have a nano-crystalline phase embedded in an amorphous phase and may exhibit super-capacitive and/or electrochromic properties.

An exemplary method of producing a nano-composite material having a nano-crystalline phase embedded in an amorphous phase may comprise: reactive co-sputtering a transition metal and a refractory metal in a reactive oxidizing atmosphere, depositing a transition metal oxide and a refractory metal oxide on a substrate and thermally annealing the deposited transition metal oxide and refractory metal oxide in an oxygen atmosphere.

An exemplary nano-composite material having a $NiO_{y1}$ nano-crystalline phase embedded in a $TaO_{y2}$ amorphous phase may be produced by: reactive co-sputtering (e.g., using Ni, Co, Fe, Mn, Ti, etc. including others that will be apparent to those skilled in the art) in an oxygen atmosphere, depositing $NiO_{x1}$ and $TaO_{x2}$ on a substrate, and thermally annealing the deposited substrate in an oxygen atmosphere.

A method of producing a nano-composite material is disclosed comprising co-depositing a transition metal and a refractory metal in a first reactive atmosphere; depositing two distinct phases, one nano-crystalline, another amorphous on a substrate (preferably an electrically conducting or transparent material) and thermally annealing (at 200-600° C. (preferably 350° C.)) in an oxygen environment the deposited transition metal and refractory metal in a second reactive atmosphere. The refractory metal comprises Ta, W, Zr, Nb, Mo or others apparent to those skilled in the art. The first and second reactive atmospheres comprise $O_2$, $F_2$, $Cl_2$, $N_2$, $NH_3$, and/or other sulfur-bearing gases apparent to those skilled in the art. The preferred transition metal comprises Ni and the preferred refractory metal comprises Ta in which a Ta:Ni ratio of 0.11 to 0.44 (preferably 0.26) is provided. The nano-crystalline phase is $NiO_{y1}$ and the amorphous phase is $TaO_{y2}$.

Further disclosed is nano-composite material (exhibiting super-capacitive properties) having a nano-crystalline phase embedded in an amorphous phase which exhibits optical modulation; wherein applying a charge to the material with a positive voltage results in ion disassociation from the nano-crystalline phase into the amorphous phase and electron disassociation from the nano-crystalline phase to the electrical contact. Consequently, releasing a charge from the material with negative voltage results in ion and electron association with the nano-crystalline phase. However, as will be apparent to those skilled in the art, the material may exhibit both optical modulation and super-capacitive properties simultaneously.

The nano-composite material can be produced by reactive co-sputtering Ni and Ta in an oxygen atmosphere; depositing $NiO_{x1}$ and $TaO_{x2}$ on a substrate and thermally annealing the deposited substrate.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Briefly, a radio frequency (RF) magnetron sputter deposition process may be implemented using an oxygen atmosphere and a composite (e.g., bimetallic) target to produce a thin film of nano-composite material consisting essentially of polycrystalline nickel oxide and amorphous tantalum oxide (e.g., $NiO/Ta_2O_5$). The specific capacitance of the nano-composite material may be controlled by varying the ratio of tantalum oxide to nickel oxide during the sputter deposition process. In one example, transmission electron microscopy (TEM) images showed nano-sized polycrystalline particles of NiO embedded in an amorphous $Ta_2O_5$ matrix. The nano-composite materials exhibit an optical density change of 0.22 at a wavelength of 670 nm and capacitor-type charge/discharge properties in an anodic coloring fashion. Accordingly, these nano-composite materials have application as electrochromic devices as well as electrochemical super-capacitors, to name only a few examples.

Exemplary nano-composite materials having a nano-crystalline phase embedded in an amorphous phase, and methods of production thereof may be better understood with reference to the Figures and following discussion.

Figure 1:
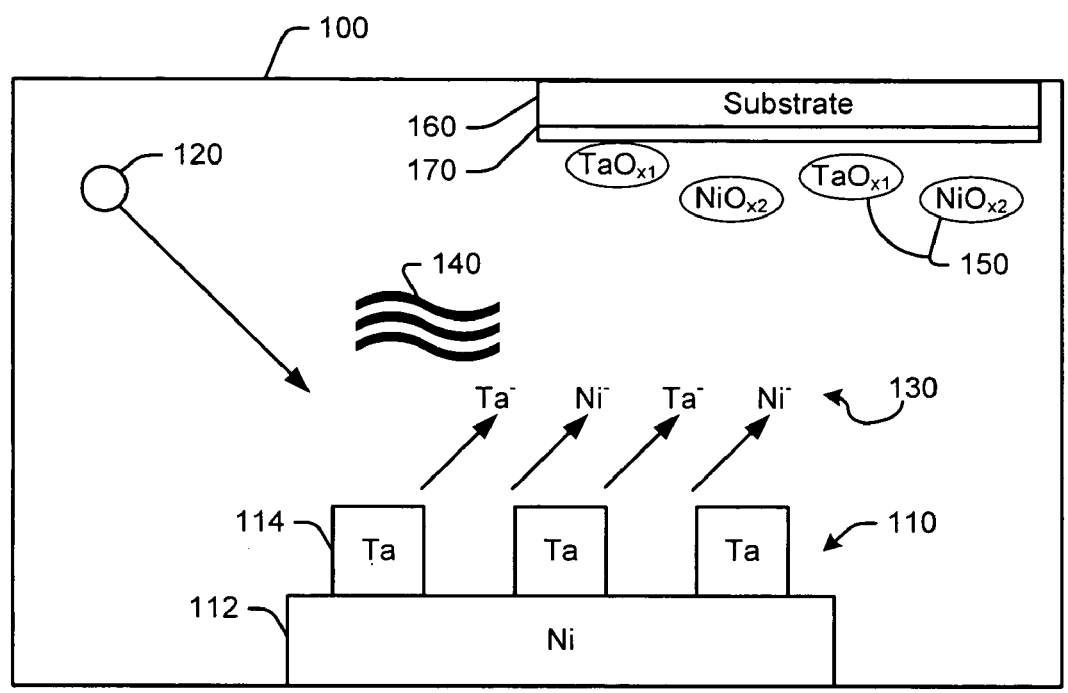
FIG. 1 is a high-level schematic illustration of an exemplary reactive co-sputtering process that may be implemented to produce a nano-composite material.

FIG. 1 is a high-level schematic illustration of an exemplary reactive co-sputtering process for producing a nano-composite material having a nano-crystalline phase embedded in an amorphous phase. Reactive co-sputtering, also known as sputter deposition or physical vapor deposition (PVD), is a well known technique for depositing thin metal oxide layers (or films) on a substrate.

In an exemplary embodiment, the reactive co-sputtering process may be implemented as RF-magnetron reactive sputtering. A plasma chamber 100 is provided with a bimetallic cathode 110. The bimetallic cathode 110 may include a transition metal 112 (e.g., Ni, Co, Fe, Mn, Ti, etc., including others that will be apparent to those skilled in the art) and a refractory metal 114 (e.g., Ta, W, Zr, Nb, Mo, etc., including others that will be apparent to those skilled in the art). For purposes of illustration, the metal cathode 110 in FIG. 1 includes a Ni transition metal 112 and a Ta refractory metal 114.

During the reactive co-sputtering process, the bimetallic cathode 110 may be bombarded by ions 120 (e.g., Argon 40), which causes metal atoms 130 (e.g., $Ta^-$ and $Ni^-$) to be dislodged and emitted from the surface of the bimetallic cathode 110. The metal atoms 130 may be subjected to a reactive environment 140 (e.g., using $O_2$, $F_2$, $Cl_2$, $N_2$, or $NH_3$, or sulfur-bearing gases.) prior to deposition to form metal oxides 150 (e.g., $TaO_{x1}$, $NiO_{x2}$), or other metal compounds (e.g., chlorides, fluorides, or nitrides). The subscripts "X1" and "X2" refer to the atomic ratios.

The metal compounds 150 deposit on a target or substrate material 160 as a thin composite film 170, thereby forming a nano-composite material having a nano-crystalline phase embedded in an amorphous phase. In exemplary embodiments, the substrate material 160 may be an electrically conducting material, e.g., a tin oxide-coated glass, copper, aluminum or other material. However, the substrate material 160 is not limited to any particular type of material. The substrate material 160 will depend at least to some extent on the application, as will be understood by those having ordinary skill in the art after becoming familiar with the teachings herein.

It is noted that the reactive co-sputtering process may also include additional operations. In an exemplary embodiment, the substrate material 160 having the deposited thin metal oxide film 170 may be thermally annealed (e.g., heated to 200-600° C. in an oxygen environment). Thermal annealing was shown to result in nano-composite materials that exhibit p-type conductivity and super-capacitive properties. Other operations may also include varying operating parameters, e.g., temperature, relative concentrations of the metal ions, etc. Still other operations may also be implemented, as may be required to produce composite materials with specific physical and electronic properties.

Before continuing, it is also noted that the reactive co-sputtering process described above with reference to FIG. 1 is provided for purposes of illustration and is not intended to be limiting. Other types of deposition processes, e.g., chemical vapor deposition, physical vapor deposition or others, now known or later developed, are also contemplated as being suitable for the described purposes.

Figures 2, 2A, 2B:
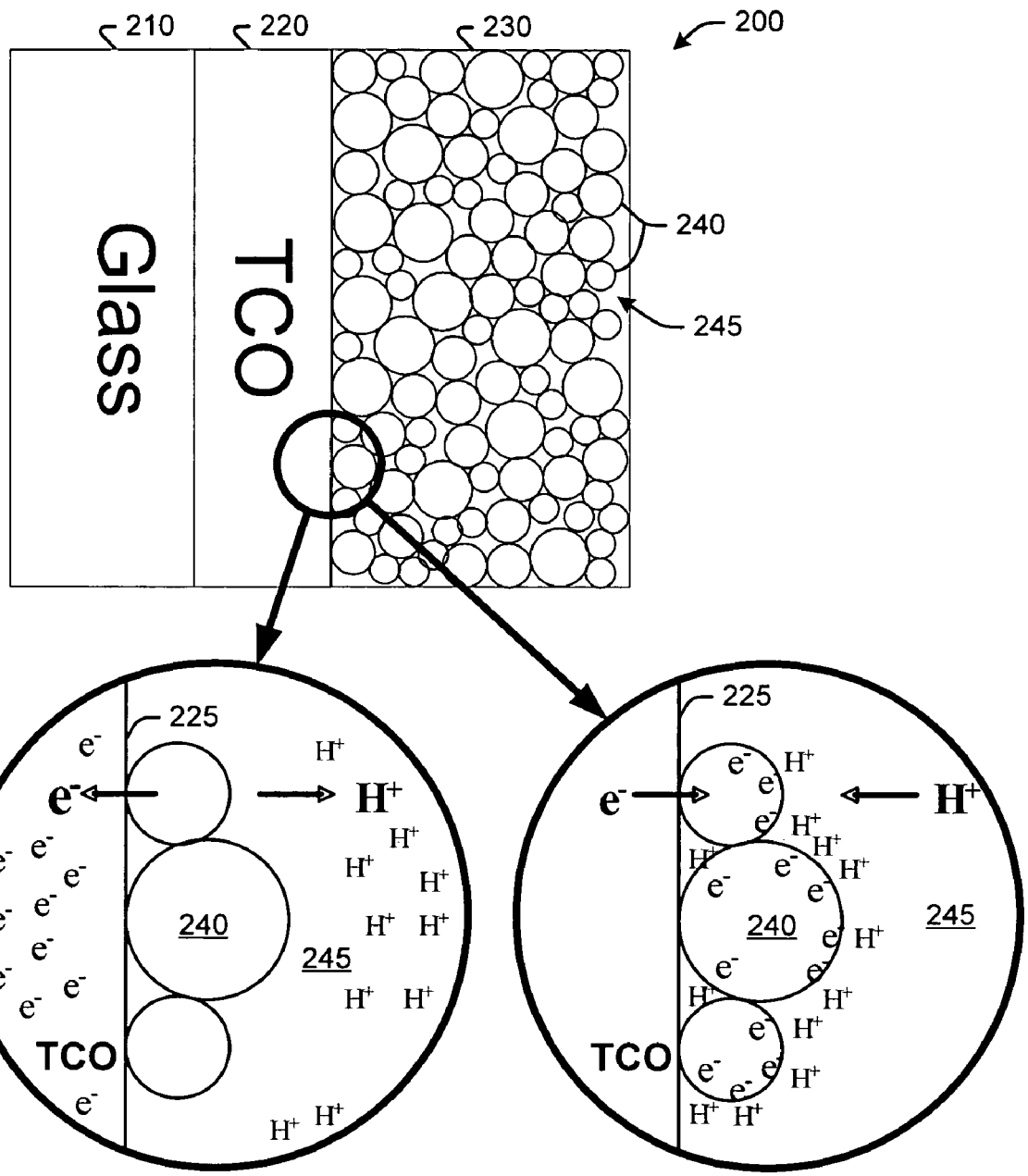
FIG. 2 is a high-level schematic illustration of an exemplary nano-composite material.
FIG. 2a is an exploded view of the exemplary nano-composite material of FIG. 2 illustrating a charge effect.
FIG. 2b is an exploded view of the exemplary nano-composite material of FIG. 2 illustrating a discharge effect.

FIG. 2 is a high-level schematic illustration of an exemplary nano-composite material 200 having a nano-crystalline phase embedded in an amorphous phase. Nano-composite material 200 may be produced, e.g., according to the reactive co-sputter deposition process described above for FIG. 1.

In an exemplary embodiment, nano-composite material 200 may include a transparent substrate 210 (e.g., glass, or other transparent material apparent to those skilled in the art) having a transparent conductive oxide (TCO) layer 220. TCO layer 220 is a transparent substance with high electronic conductivity for e.g., tin oxide, indium-doped oxide, indium-doped tin oxide or other oxides. A thin metal oxide layer or film 230 having a nano-crystalline phase embedded in an amorphous phase is deposited on the TCO layer 220. Nano-composite material 200 is shown in more detail in FIGS. 2a and 2b. More particularly, FIGS. 2a and 2b show the boundary 225 between TCO layer 220 and the thin metal oxide film 230.

The thin metal oxide film 230 includes a nano-crystalline phase 240 embedded in an amorphous phase 245. In an exemplary embodiment, the nano-crystalline phase 240 is a transition metal oxide (e.g., Ni, Co, Fe, Mn, Ti, etc., including others that will be apparent to those skilled in the art) deposited on TCO layer 220 and glass 210 substrate during a reactive co-sputtering process. The amorphous phase 245 is a refractory metal oxide (e.g., Ta, W, Zr, Nb, Mo, etc., including others that will be apparent to those skilled in the art) deposited on TCO layer 220 and transparent substrate 210 during a reactive co-sputtering process or others appropriate processes mentioned above. The amorphous phase 245 fills the void space formed between adjacent surfaces of the nano-crystalline phase 240 and enables a higher physical contact level than can be achieved by a liquid.

FIG. 2a is an exploded view of the exemplary nano-composite material 200 of FIG. 2 illustrating a combined electronic and optical effect as charge is transported in the material. FIG. 2b is an exploded view of the exemplary nano-composite material of FIG. 2 illustrating a discharge effect. The crystalline phase 240 serves as an electro-optically active material, and the amorphous phase serves as a solid electrolyte.

Applying a charge to the nano-composite material 200 causes the negatively charged electrons (e−) to be driven into the TCO layer 220 and positively charged ions (protons H$^+$) to disassociate from the nano-crystalline phase 240 into the amorphous phase 245, effecting a color change in the nano-composite material 200. Releasing the charge causes the negatively charged particles (electrons e$^-$) and positively charged particles (protons H$^+$) to associate with the crystalline phase 240, having a bleaching effect (loss of color) in the nano-composite material 200.

The nano-composite structure (e.g., polycrystalline NiO particles surrounded by amorphous $Ta_2O_5$) exhibits electrochromic and/or super-capacitive properties. By way of example, $NiTa_{0.26}O_{1.65}$ exhibits a substantial optical density change (0.2 at a wavelength of 670 nm) with capacitor-type charge/discharge properties in an anodic coloring fashion.

The charge transport exhibits simultaneous supercapacitive behavior and optical modulation. That is, in the presence of proton cations in an amorphous $Ta_2O_5$ electrolyte, discharging and charging of large double layer capacitance replaces ion-insertion as the electrochromic mechanism. Although there is no ion insertion, there is electron insertion from back contact which is compensated by solvated ions (proton ions). These electrons can change the valence states of transition metals in oxide matrix resulting in an electrochromic effect (e.g., $Ni^{3+} \rightarrow Ni^{2+}$).

Electrochromism induced by supercapacitor discharging/charging has several advantages in comparison to conventional electrochromic technologies. Since there is no ion intercalation, the long term durability of the electrochromic devices is significantly improved. Since there is no mass transfer process into the electrochromic materials, the response time is extremely fast (as determined by the double layer capacitor discharge rate).

It is readily appreciated that applications of this technology may include, but are not limited to, energy storage (e.g., batteries), dynamic transmittance for "smart" windows, sunroofs, as well as opto-electronic "shutters. Other applications may also include magnetic storage media, hydrogen sensors, visual charge storage indicators (e.g., for batteries).

Example

In this example, thin film nano-composites of polycrystalline nickel oxide and amorphous tantalum oxide electrolyte were deposited by reactive RF-magnetron sputtering in an oxygen environment using a bimetallic (Ni and Ta) target. The thin films were prepared on indium tin oxide (ITO) coated glass for optical transmittance and electrochemical measurements; on polished stainless steel substrates for Raman spectroscopy and TEM measurements; and on glass substrates for X-ray diffraction analyses.

The thin film nano-composites were evaluated using X-ray photoelectron spectroscopy (XPS) analyses and inductively coupled plasma (ICP) spectrometry. The compositional ratio of the thin film nano-composites were adjusted by changing the surface ratio of the tantalum array on the nickel target. The electrochemical characteristics of the resulting nano-composite $NiO/Ta_2O_5$ electrodes were examined in KCl aqueous solutions using cyclic voltammetry and alternating current (AC) impedance spectroscopy.

Figure 3:
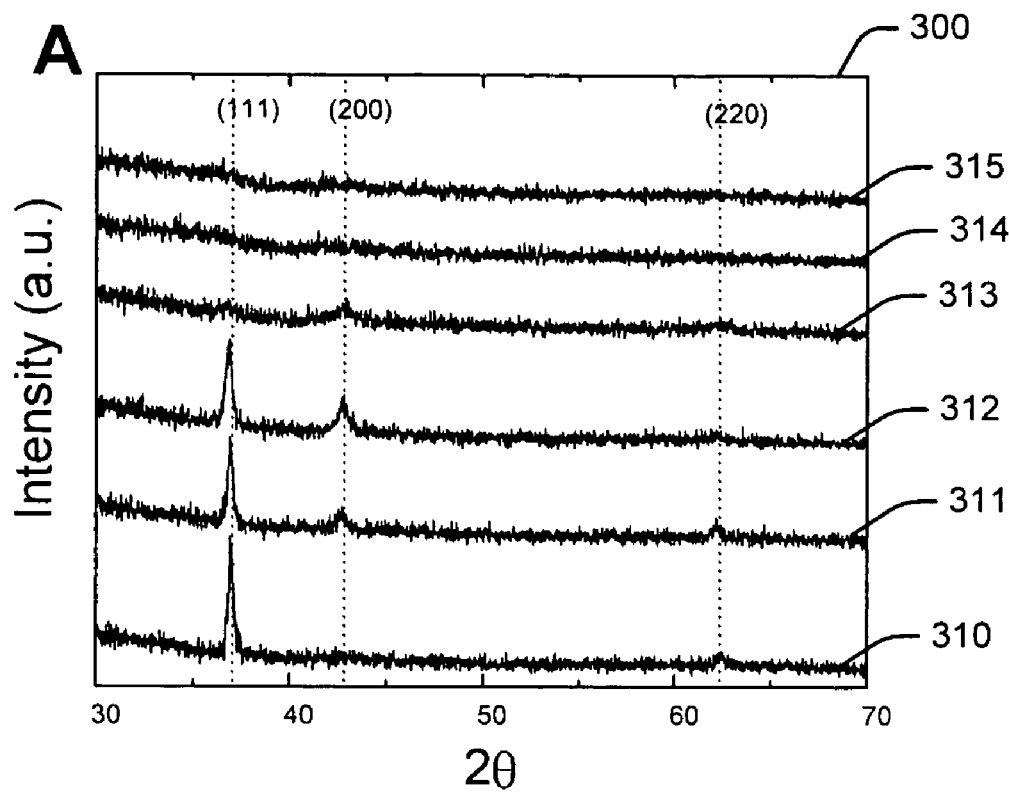
FIG. 3 is a plot showing X-ray diffraction patterns of exemplary nano-composite materials.

FIG. 3 is a plot 300 showing a sequence of x-ray diffraction patterns of the $NiO/Ta_2O_5$ nano-composite thin films that were prepared on glass substrates with various concentrations of tantalum oxide. The spectra 310-315 are shown displaced vertically from one another on the plot 300 for purposes of comparison and clarity. Plot 310 corresponds to a NiO film (i.e., no tantalum oxide content). Tantalum oxide content in the nano-composite thin films increased for plots 311-315. Plot 311 corresponds to $NiTa_{0.11}O_{1.275}$, plot 312 corresponds to $NiTa_{0.19}O_{1.475}$, plot 313 corresponds to $NiTa_{0.26}O_{1.65}$, plot 314 corresponds to $NiTa_{0.33}O_{1.825}$, plot 315 corresponds to $NiTa_{0.41}O_{2.025}$.

It is readily observed that the NiO film with no tantalum oxide content (spectra 310) exhibits a crystalline phase (rock salt, NiCl) with a strong 111 diffraction peak, indicating a preferred orientation. As the concentration of tantalum oxide in the films increases (from spectra 311-315), the relative intensity of the nickel oxide (111) peak decreases and eventually the nano-composite thin films appear completely amorphous (spectra 315). It is noted that even though the x-ray diffraction indicates that everything is amorphous, the TEM images clarify that the NiO remains crystalline.

The decrease in peak intensity is due to the decreasing particle size of the nickel oxide, which directly impacts the specific capacitance of the nano-composite material. It should be noted that even at an atomic ratio of Ta/Ni=0.41 (spectra 315), there are no peaks related to tantalum oxide, indicating the amorphous nature of tantalum oxide in these nano-composite thin films. This interpretation of the x-ray data is confirmed by high-resolution transmission electron microscopy (TEM).

Figure 4:
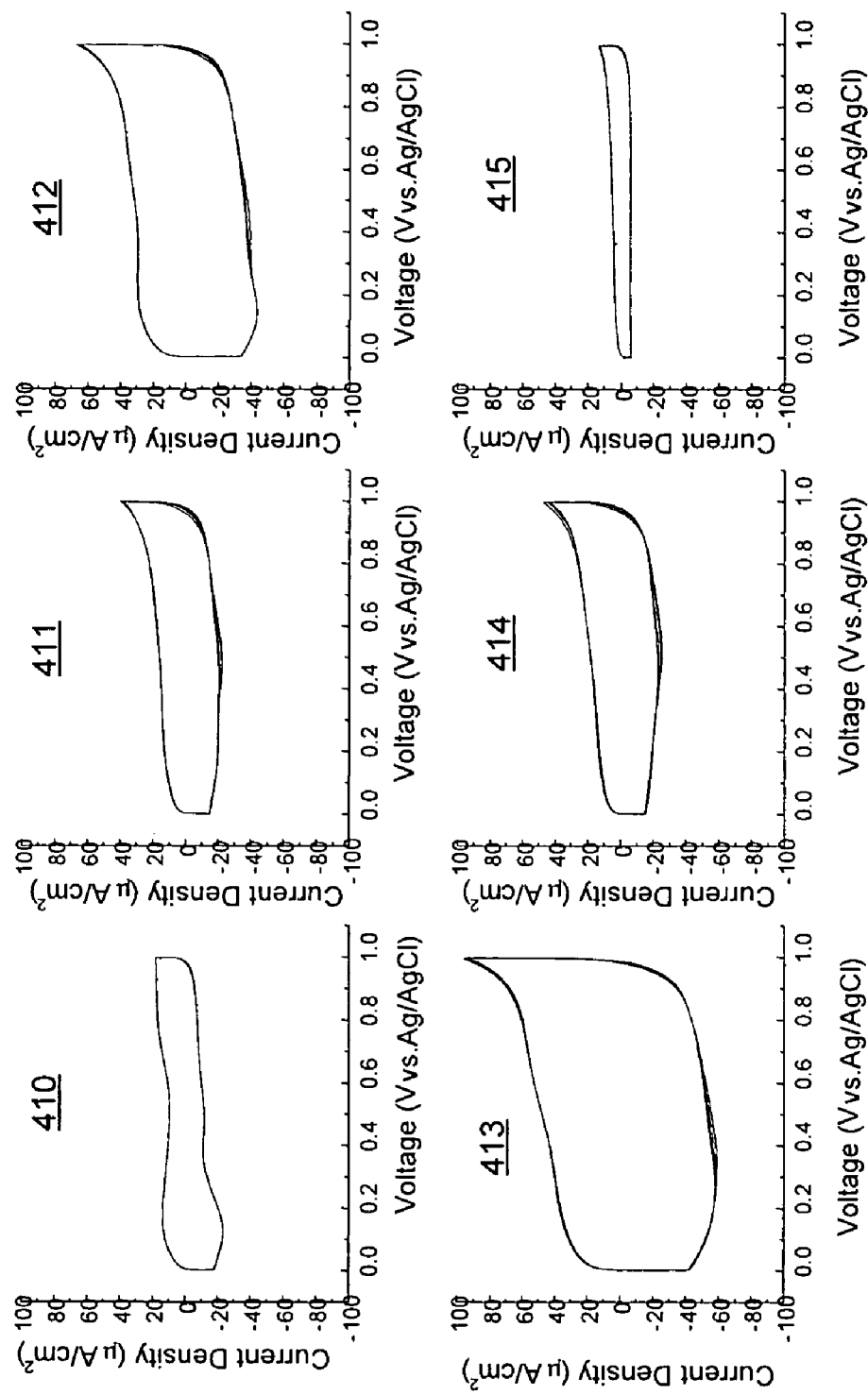
FIG. 4 shows cyclic voltammograms of exemplary nano-composite materials.

Cyclic voltammetry measurements (in 1 M KCl and a scan rate of 10 milliVolts/second) were also used for electrochemical characterization of the nano-composite thin films. FIG. 4 shows the cyclic voltammograms of the composite films as a function of the concentration of tantalum oxide in the films. Plot 410 shows the cyclic voltammetry measurements for a NiO film (i.e., no tantalum oxide content). Tantalum oxide content in the nano-composite thin films increased for plots 411-415. Plot 411 corresponds to $NiTa_{0.11}O_{1.275}$, plot 412 corresponds to $NiTa_{0.19}O_{1.475}$, plot 413 corresponds to $NiTa_{0.26}O_{1.65}$, plot 414 corresponds to $NiTa_{0.33}O_{1.825}$, plot 415 corresponds to $NiTa_{0.41}O_{2.025}$.

In general all the film electrodes exhibited some supercapacitive properties. The supercapacitor resembles a regular capacitor with the exception that it offers very high capacitance in a small package. Energy storage is by means of static charge rather than of an electrochemical process that is inherent to a battery. Applying a voltage differential on the positive and negative plates charges the supercapacitor. This concept is similar to an electrical charge that builds up when walking on a carpet. The supercapacitor concept has been around for a number of years. Newer designs allow higher capacities in a smaller size. Whereas a regular capacitor consists of conductive foils and a dry separator, the supercapacitor crosses into battery technology by using special electrodes and some electrolyte. The high surface electrode material, also called Double Layer Capacitor (DLC) stores the energy in the double layer formed near the carbon electrode surface. It is readily observed that increasing the concentration of tantalum oxide also increased the specific capacitance of the nano-composite thin films, but only to a point. In this example, the specific capacitance reached a maximum when the Ta/Ni atomic ratio reached 0.26 (as shown in plot 413), and then decreased as the amount of tantalum oxide continued to increase (as shown in plots 414 and 415).

The trend observed with regard to FIG. 4 may be attributed to a change in the surface area of the NiO nano-particles in the nano-composite thin films. This is supported by the x-ray diffraction analysis (FIG. 3), which shows the particle size of the nickel oxide decreasing as the concentration of tantalum oxide increases, resulting in a higher surface area of the nickel oxide. However, further increasing the tantalum oxide caused some of the nickel oxide nano-particles to become electrically isolated from each other, resulting in a decrease of the specific capacitance.

Figure 5:
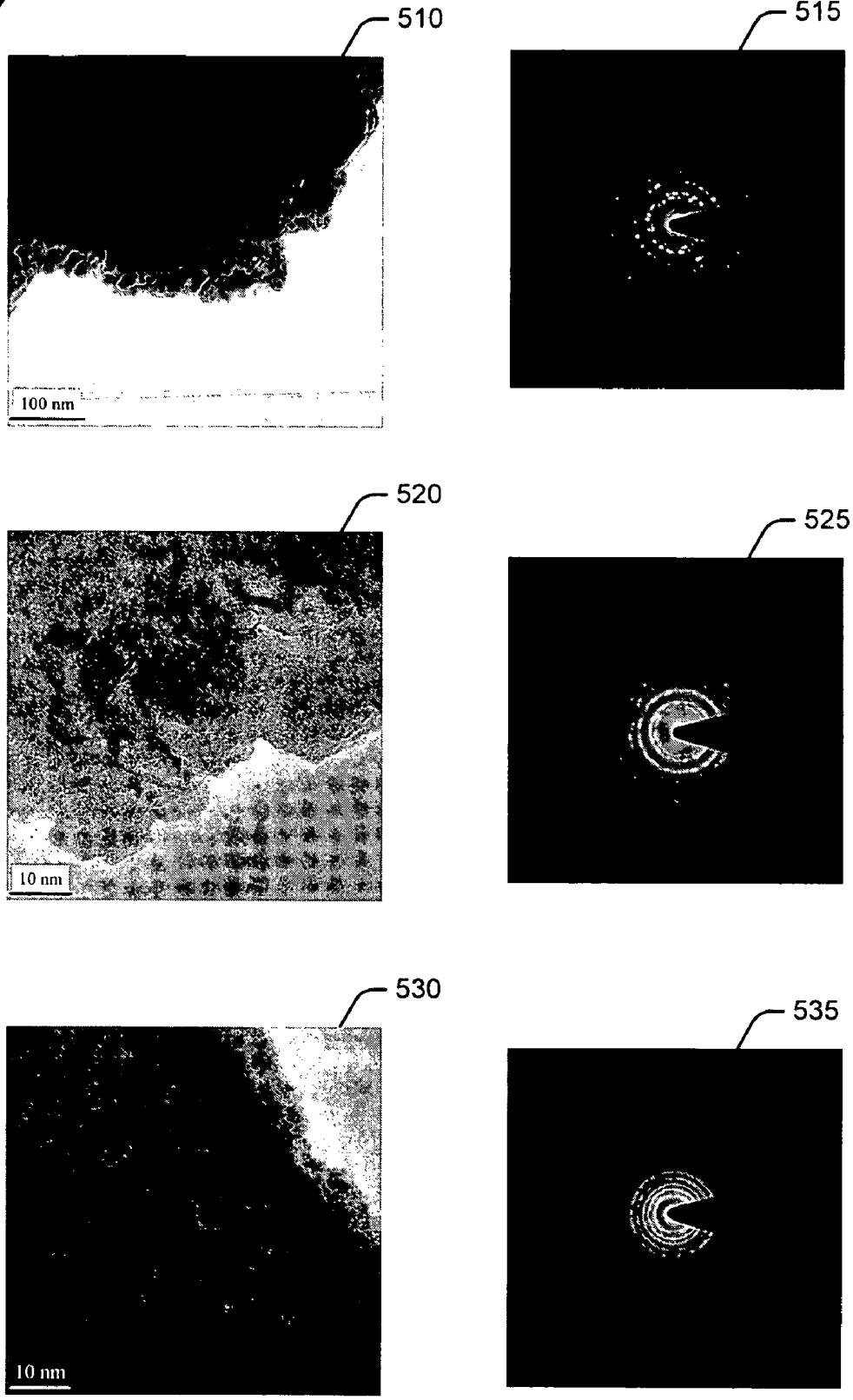
FIG. 5 are transmission electron microscopy (TEM) images and corresponding selected area electron diffraction (SAED) patterns of exemplary nano-composite materials.

FIG. 5 shows TEM images (510, 520, and 530) and corresponding selected-area electron diffraction (SAED) pattern images (515, 525, and 535, respectively) of the NiO—$Ta_2O_5$ nano-composites as a function of increasing atomic ratio. More particularly, images 510 and 515 are for a nano-composite thin film having a Ta/Ni ratio of 0.11. Images 520 and 525 are for the nano-composite thin films having a Ta/Ni ratio of 0.26. Images 530 and 535 are for the nano-composite thin films having a Ta/Ni ratio of 0.41. The images show that NiO particle size is inversely proportional to the Ta content (i.e., an increase in the TA content resulted in a decrease of NiO particle size).

TEM image 510 shows the NiO—$Ta_2O_5$ nano-composite with an atomic ratio of Ta/Ni=0.11. A two dimensional ordering of nickel oxide layers is readily observed. In perspective of the x-ray diffraction data shown in FIG. 3, the NiO—$Ta_2O_5$ nano-composite (atomic ratio of Ta/Ni=0.11) exhibits a preferred orientation along the [111] direction. A pattern of distinct spots is readily observed in the corresponding selected-area electron diffraction (SAED) image 515. The relatively large grain size indicates the crystalline nature of the nickel oxide.

TEM image 520 shows the NiO—$Ta_2O_5$ nano-composite with an atomic ratio of Ta/Ni=0.26. It is readily observed that as the concentration of tantalum oxide in the films increases, two dimensional ordering disappears and the grain size decreases to approximately 30 nm. The presence of a weak and wide ring in addition to clear spots in the corresponding SAED pattern 525 indicates a smaller grain size of the nickel oxide.

TEM image 530 shows the NiO—$Ta_2O_5$ nano-composite with an atomic ratio of Ta/Ni=0.41. It is readily observed that as the concentration of tantalum oxide in the films increased, the size of the NiO particles decrease. The presence of solid rings in the corresponding SAED pattern 535 also indicates the composite film has a completely amorphous phase. However, close examination of the TEM images shows that the NiO particles still exhibit ordered structures, and the $Ta_2O_5$ film around it continues to be completely amorphous. It is understood that below a certain size scale, crystalline particles are indistinguishable from amorphous phases by x-ray diffraction.

Figure 6:
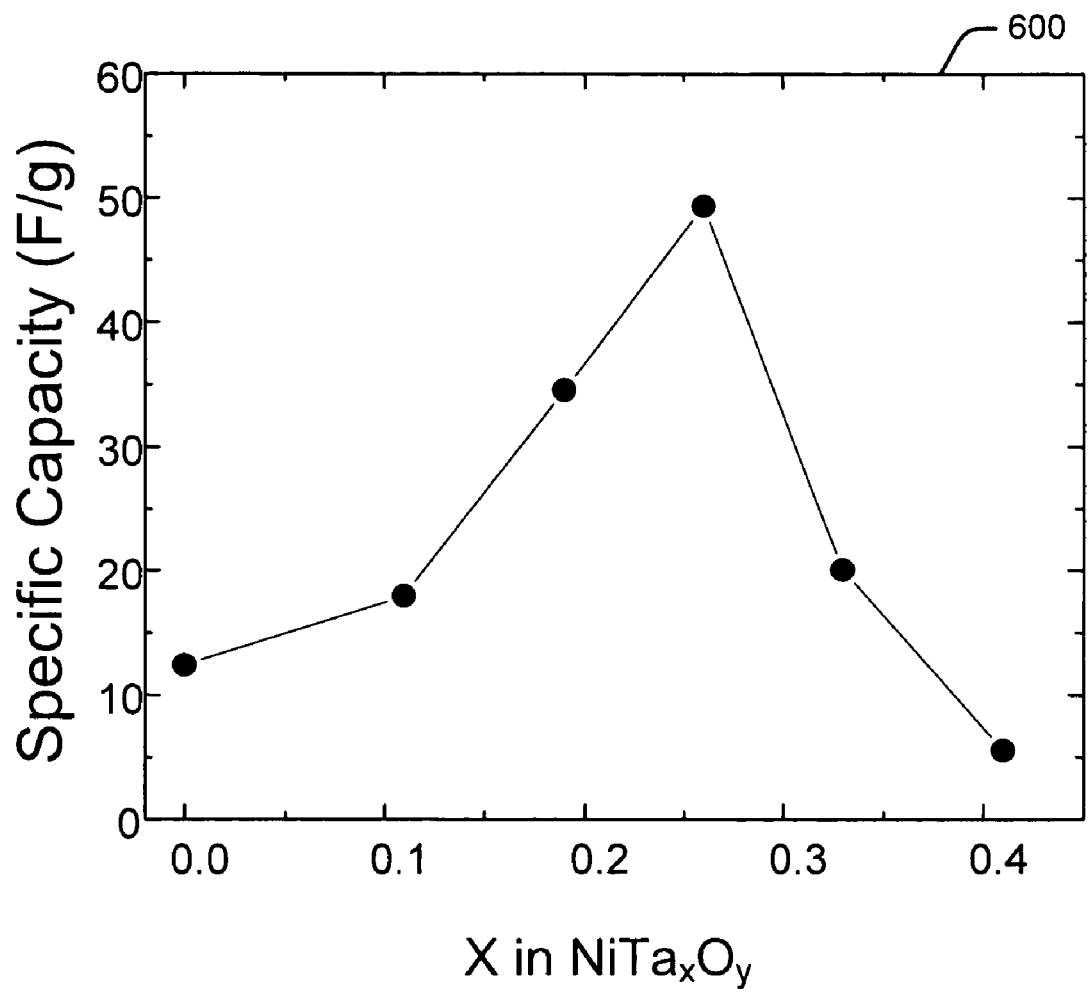
FIG. 6 is a plot showing specific capacitance of an exemplary nano-composite material.

FIG. 6 is a plot 600 showing specific capacitance of exemplary nano-composite materials having a nano-crystalline phase embedded in an amorphous phase at different tantalum concentrations. It is readily observed that the NiO—$Ta_2O_5$ nano-composites exhibit increasing specific capacitance up to an atomic ratio (Ta:Ni) of 0.26, and then decreasing at higher Ta concentrations. It will be apparent upon reference to FIG. 6 that the Ta:Ni ratio may be 0.11 to 0.44.

Figure 7:
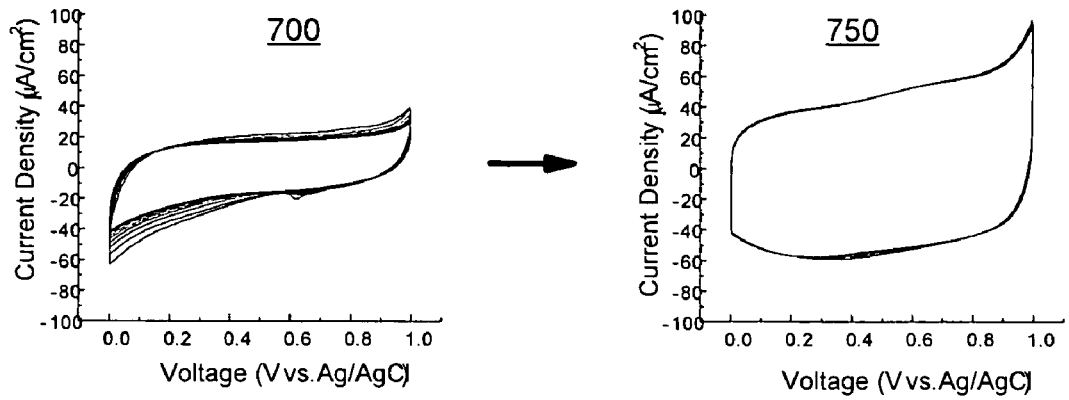
FIG. 7 shows current density plots illustrating the effect of thermal annealing of an exemplary nano-composite material.

FIG. 7 shows current density plots 700, 750 illustrating the effect of thermal annealing of an exemplary nano-composite material having a nano-crystalline phase embedded in an amorphous phase. It is readily observed in plot 700 that the as-deposited NiO—$Ta_2O_5$ nano-composite thin film (i.e., without thermal annealing) exhibit r-type conductivity with a minor capacitance characteristic. After thermal annealing at 350° C. in an oxygen environment, the NiO—$Ta_2O_5$ nano-composite thin film exhibits p-type conductivity and super-capacitive properties, as shown in plot 750.

Figure 8:
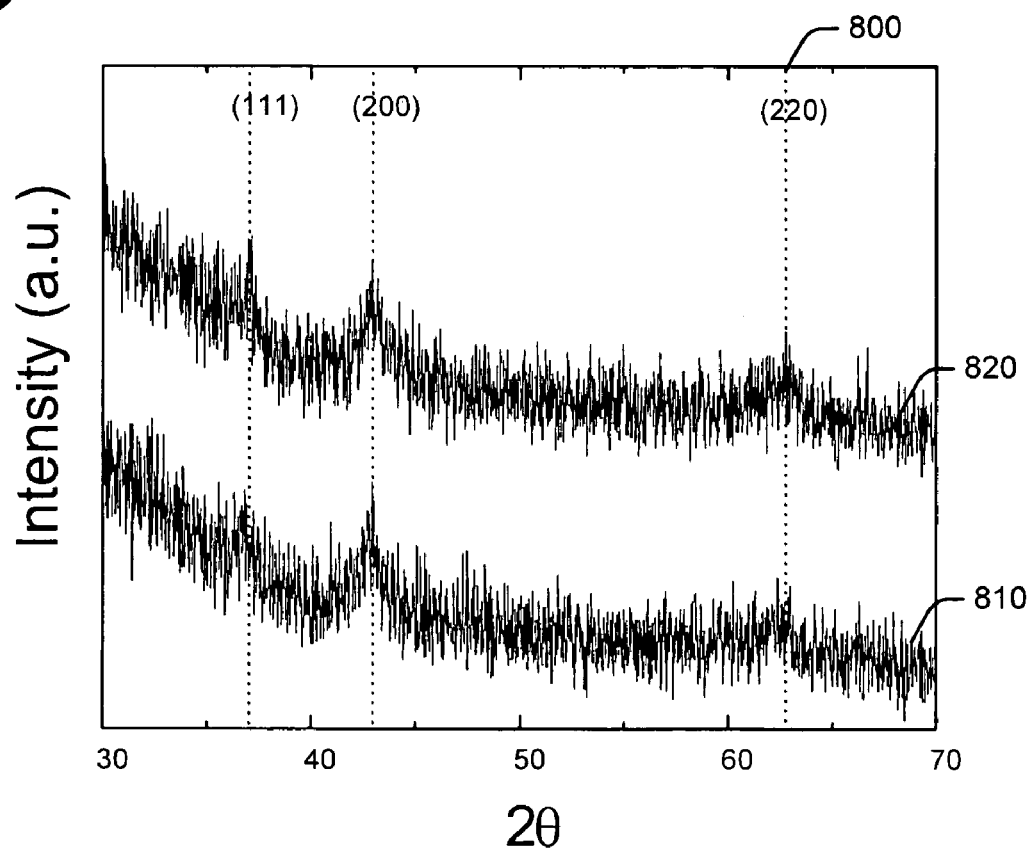
FIG. 8 is a plot showing X-ray diffraction patterns illustrating the effect of thermal annealing of an exemplary nano-composite material.

FIG. 8 is a plot 800 showing X-ray diffraction patterns illustrating the effect of thermal annealing of an exemplary nano-composite material having a nano-crystalline phase embedded in an amorphous phase. X-ray diffraction pattern 810 is shown in plot 800 for as-deposited NiTaO having an atomic ratio (Ta:Ni) of 0.26. X-ray diffraction pattern 820 is also shown in plot 800 for NiTaO having an atomic ratio (Ta:Ni) of 0.26 after thermal annealing at 350° C. in an oxygen environment. It is readily observed that the NiO remains crystalline during oxygen uptake of thermal annealing and the TaOx remains amorphous during oxygen uptake of thermal annealing.

Figure 9:
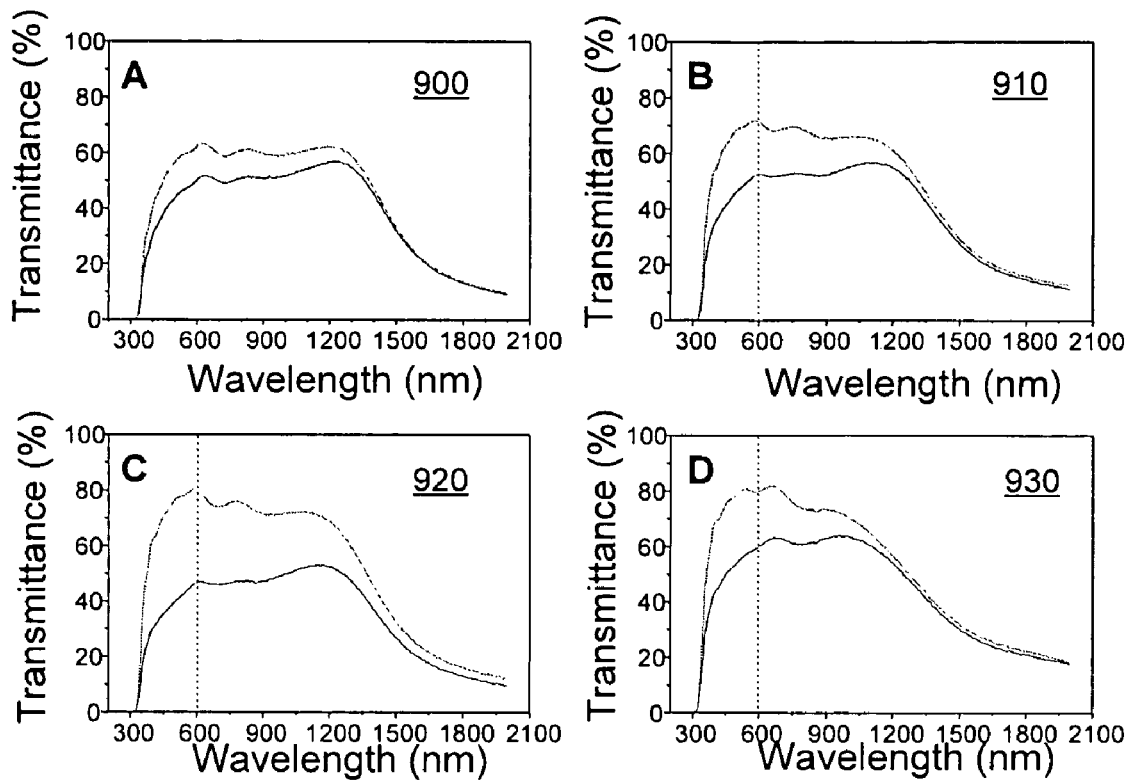
FIG. 9 are transmittance spectra plots of an exemplary nano-composite material.

FIG. 9 are plots of transmittance spectra for exemplary nano-composite material having a nano-crystalline phase embedded in an amorphous phase. The electrochemical and electrochromic characteristics of nano-composite NiO/$Ta_2O_5$ electrodes were examined in a neutral KCl aqueous solution using cyclic voltammetry (CV). Platinum (Pt) foil and Ag/AgCl electrodes were used as the counter and reference electrode, respectively. For the coloration efficiency measurement, the in-situ optical density variation of the composite electrode was monitored with constant discharging current (0.5 mA/cm²). The transmittance was measured with a laser diode at 670 nm wavelength.

Plot 900 shows the percentage transmittance at different wavelengths for $NiTa_{0.11}O_{1.275}$. Plot 910 shows the percentage transmittance at different wavelengths for $NiTa_{0.19}O_{1.475}$. Plot 920 shows the percentage transmittance at different wavelengths for $NiTa_{0.26}O_{1.65}$. Plot 930 shows the percentage transmittance at different wavelengths for $NiTa_{0.33}O_{1.825}$. Each of these plots illustrate anodic coloration, indicating that the NiO—Ta$_2$O$_5$ nano-composite thin film is a good complementary counter electrode for use in electrochromic devices.

Figure 10:
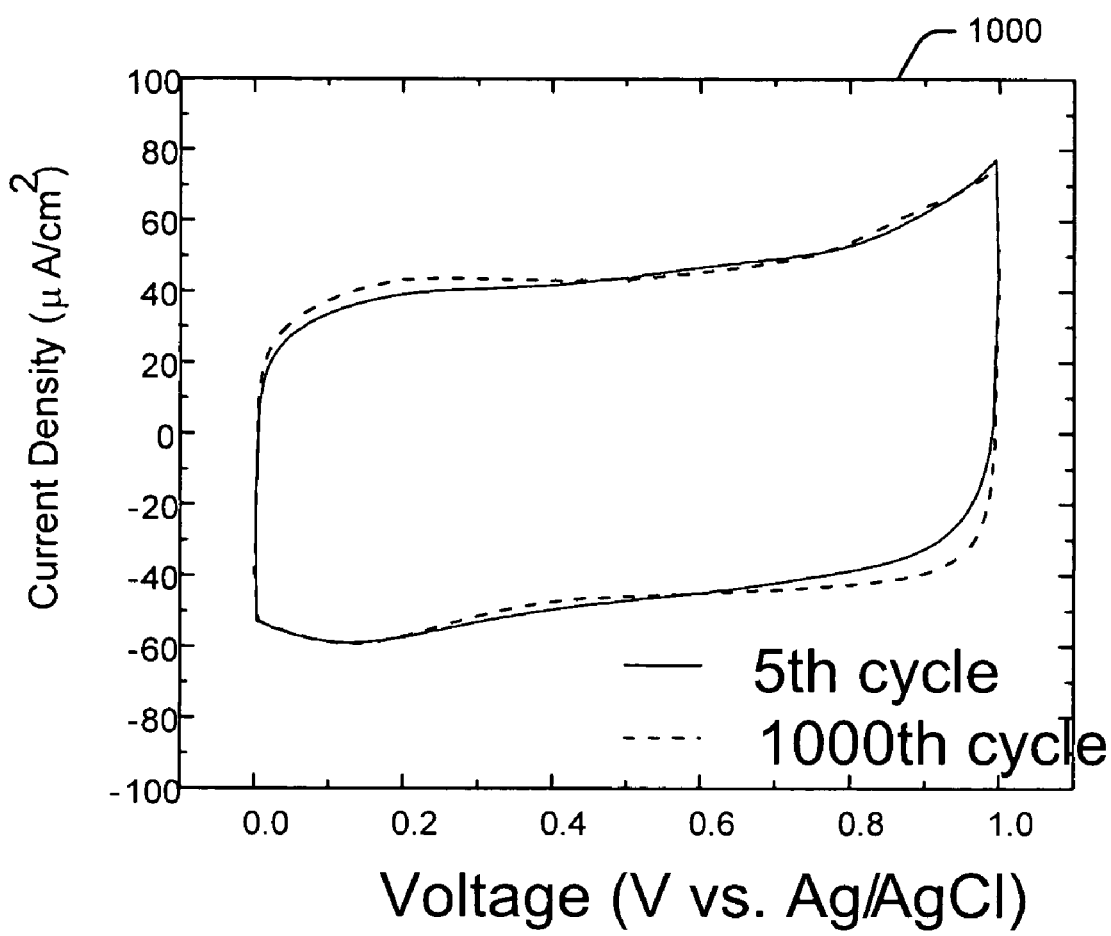
FIG. 10 is a cyclic voltammogram of an exemplary nano-composite material.

FIG. 10 is a cyclic voltammogram showing electrochemical stability of an exemplary NiO—Ta$_2$O$_5$ nano-composite film electrode with an atomic ratio of Ta/Ni=0.26. It is readily observed from the plot 1000 that the current response increased slightly during 1000 cycles without significant change in shape. Accordingly, plot 1000 illustrates that the ions are associating with the surface and not being inserted into the crystalline substructure, resulting in a longer life for the nano-composite thin film.

An accumulation of non-mobile ions in the layers of a conventional electrochromic device may result in irreversible changes to the optical and electrical properties of the device, causing degradation of the device over time. For example, permanent ion incorporation in tungsten oxide films used in conventional electrochromic devices may result in a reduction of the Electromotive Force (EMF). Accordingly, higher voltages may be applied during operation of the device to compensate for this reduction of the EMF in order for the device to provide the same optical modulation. However, these higher voltages result in further degradation of the device over time.

Figure 11:
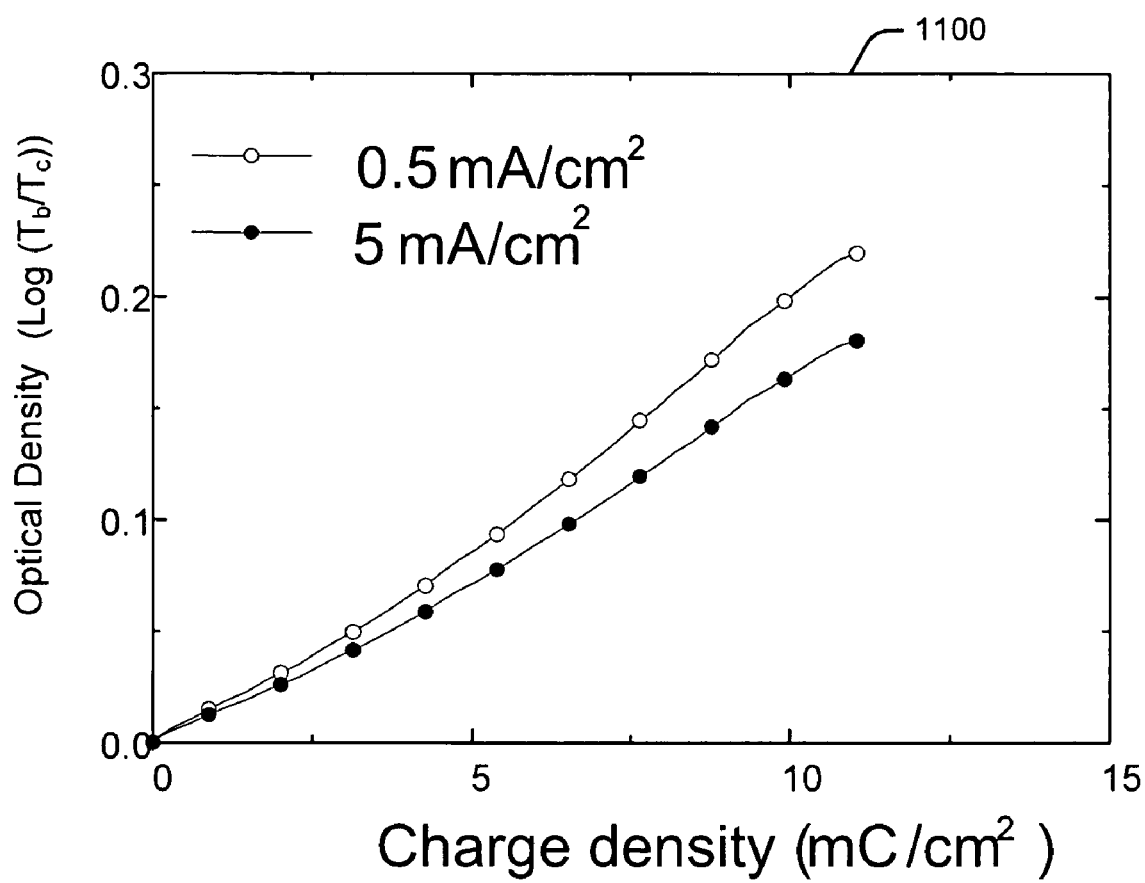
FIG. 11 is an optical density plot showing the coloration efficiency at 670 nm of an exemplary nano-composite material at two different current densities.

FIG. 11 describes an optical modulation of the material by showing an optical density plot of the coloration efficiency at a wavelength of 670 nm for an exemplary nano-composite material having a nano-crystalline phase embedded in an amorphous phase. The in-situ optical density variation (constant charging current) of the nano-composite electrode having an atomic ratio of Ta:Ni of 0.26 was monitored with a laser diode at 670 nm wavelength.

Plot 1100 shows the change in optical density at a wavelength of 670 nm versus charge density with a capacitor charge. The composite film electrode exhibits a change in optical density from 0 to 0.22 with capacitor charge at current density of 0.5 mA/cm$^2$. Even at a current density of 5 mA/cm$^2$, the electrode still maintains an optical density of 0.18, indicating a fast response time as preferred for use as electrochromic devices and electrochemical capacitors.

It is also observed in plot 1100 that the NiO—Ta$_2$O$_5$ nano-composite film electrode changes color in an anodic (electron ejection) coloring fashion. In other words, the film bleaches with discharge (reduction) in contrast to conventional cathodic electrochromic materials (e.g., WO$_3$, which colors with proton insertion and electron injection). In this regard, the NiO—Ta$_2$O$_5$ nano-composite thin films may be used as a counter electrode in a complementary-type electrochromic device. That is, as the H+ or Li+ is removed from the counter electrode and inserted into the working electrode, both electrodes become denser optically, with the spectral absorption in the anode complementing that in the cathode.

It is noted that the Example 1 discussed above is provided for purposes of illustration and is not intended to be limiting. Still other embodiments and modifications are also contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A method of producing a nano-composite material comprising:

reactive sputtering a transition metal and a refractory metal in a first reactive oxidizing atmosphere; and depositing a transition metal oxide and a refractory metal oxide on a substrate and thermally annealing the deposited transition metal oxide and refractory metal oxide to form two distinct phases which exhibit super-capacitive behavior from the co-deposited metal oxides, one nano-crystalline phase consisting mostly of the transition metal, another amorphous phase consisting essentially of the refractory metal oxide wherein the nano-crystalline phase is embedded in the amorphous phase.

2. The method of claim 1, further including thermally annealing the deposited transition metal oxide and refractory metal oxide in a second reactive atmosphere of oxygen.

3. The method of claim 2 wherein the second reactive atmosphere comprises only O$_2$.

4. The method of claim 1 wherein the transition metal comprises of Ni, Co, Fe, Mn, or Ti.

5. The method of claim 1 wherein the refractory metal comprises Ta, W, Zr, Nb, or Mo.

6. The method of claim 1 wherein the first reactive atmosphere comprises at least one of O$_2$, F$_2$, Cl$_2$, N$_2$, and NH$_3$.

7. The method of claim 1 wherein the transition metal is Ni and the refractory metal is Ta.

8. The method of claim 7 wherein the Ni and Ta are provided in a Ta:Ni atomic ratio of 0.11 to 0.44.

9. The method of claim 1 wherein the nano-crystalline phase is NiO and the amorphous phase is Ta$_2$O$_5$.

10. The method of claim 1 wherein the substrate is an electrically conducting material.

11. The method of claim 1 wherein the substrate is a transparent material.

12. A nano-composite material produced according to the process of claim 1.

13. The nano-composite material of claim 12 exhibiting optical modulation.

14. The nano-composite material of claim 12 wherein applying a charge to the nano-composite material with a positive voltage results in ion disassociation from the nano-crystalline phase into the amorphous phase and electron disassociation from the nano-crystalline phase to an electrical contact.

15. The nano-composite material of claim 12 wherein releasing a charge from the nano-composite material with negative voltage results in ion and electron association with the nano-crystalline phase.

16. The nano-composite material of claim 12, said material exhibiting super-capacitive properties.

17. The nano-composite material of claim 12, said material exhibiting both optical modulation and super-capacitive properties simultaneously.

18. A nano-composite material which exhibits super-capacitive behavior and is produced by reactive co-sputtering Ni and Ta in an oxygen atmosphere; depositing NiO and Ta$_2$O$_5$ on a substrate and thermally annealing the deposited substrate to form mostly nano-crystalline NiO and amorphous Ta$_2$O$_5$ on the substrate wherein the nano-crystalline NiO is embedded in the amorphous Ta$_2$O$_5$.

19. The nano-composite material of claim 18 wherein the substrate is an electrically conducting material.

20. The nano-composite material of claim 18 wherein thermal annealing is at 200-600° C. in an oxygen environment.

21. The nano-composite material of claim 18 wherein the material has a Ta:Ni atomic ratio of 0.11 to 0.44.

22. The nano-composite material of claim 18 wherein the material has a Ta:Ni atomic ratio of 0.26.

23. A method of producing a nano-composite material with super-capacitive properties comprising:
bombarding a bimetallic cathode with argon ions to dislodge metal atoms and emit the metal atoms from the surface of the bimetallic cathode;
simultaneously with bombarding, subjecting the metal atoms to an oxidizing reactive environment prior to deposition to form metal compounds;
depositing a thin composite film on a target material; and
thermally annealing the thin composite film in a pure oxygen atmosphere to form two distinct phases, one nano-crystalline phase consisting mostly of a transition metal, another amorphous phase consisting essentially of a refractory metal wherein the nano-crystalline phase is embedded in the amorphous phase.

24. The method claim 23 wherein the thin composite film is only a hydrogen conductor.

25. The method claim 23 wherein the oxidizing reactive environment is oxygen, nitrogen, or halogen, and the metal compounds are oxides, nitrides, or halides.

26. The method claim 23 wherein thermally annealing is in mixtures of gas.

27. The method claim 26 wherein the mixtures of gas contain oxygen, nitrogen, or halogen.

* * * * *